(12) United States Patent
Lysinger et al.

(10) Patent No.: US 7,233,512 B2
(45) Date of Patent: Jun. 19, 2007

(54) CONTENT ADDRESSABLE MEMORY CIRCUIT WITH IMPROVED MEMORY CELL STABILITY

(75) Inventors: Mark Lysinger, Coppell, TX (US); Francois Jacquet, Froges (FR); Phillippe Roche, Le Versoud (FR)

(73) Assignees: STMicroelectronics, Inc., Carrollton, TX (US); STMicroelectronics SA (FR)

( * ) Notice: Subject to any disclaimer, the term of this patent is extended or adjusted under 35 U.S.C. 154(b) by 142 days.

(21) Appl. No.: 11/048,224

(22) Filed: Feb. 1, 2005

(65) Prior Publication Data
US 2006/0171183 A1    Aug. 3, 2006

(51) Int. Cl.
*G11C 15/00*    (2006.01)
(52) U.S. Cl. .................... 365/49; 365/189.07; 365/154

(58) Field of Classification Search ................. 365/49, 365/189.07, 154
See application file for complete search history.

(56) References Cited

U.S. PATENT DOCUMENTS

| 6,262,907 | B1 * | 7/2001 | Lien et al. ................. 365/49 |
| 6,678,184 | B2 | 1/2004 | Lysinger et al. ............ 365/49 |
| 6,751,110 | B2 * | 6/2004 | Hu ............................. 365/49 |
| 6,842,359 | B2 * | 1/2005 | Hata et al. .................. 365/49 |

* cited by examiner

*Primary Examiner*—Huan Hoang
(74) *Attorney, Agent, or Firm*—Lisa K. Jorgenson; Christopher F. Regan

(57) ABSTRACT

A Content Addressable Memory (CAM) circuit includes memory cells preferably formed as two memory cells each having internal nodes. A compare circuit is operative with the memory cells. A common terminal (VPL) exists for the memory cells. Capacitors are added between the internal nodes of each of the memory cells and common terminal for memory cell stability.

26 Claims, 13 Drawing Sheets

CONTENT ADDRESSABLE MEMORY CIRCUIT WITH IMPROVED MEMORY CELL STABILITY

FIELD OF THE INVENTION

The present invention relates to Content Addressable Memory (CAM) circuits, and more particularly, this invention relates to CAM circuits having improved memory cell stability.

BACKGROUND OF THE INVENTION

Content Addressable Memory (CAM) circuits use semiconductor memory components such as Static Random Access Memory (SRAM) circuits forming memory cells and additional comparison circuitry that permits any required searches to be completed in a single clock cycle. Searches using Content Addressable Memory circuits and associated comparison circuitry are typically faster than algorithmic searches. Because Content Addressable Memory circuits are faster, they are often used in Internet routers for complicated address look-up functions. They are also used in database accelerators, data compression applications, neural networks, Translation Look-aside Buffers (TLB) and processor caches.

In a content addressable memory circuit, any data is typically stored randomly in different memory locations, which are selected by an address bus. Data is also typically written directly into a first entry or memory location. Each memory location could have associated with the memory a pair of special status bits that keep track of whether the memory location includes valid data or is empty and available for overriding. Any information stored at a specific memory location is located by comparing every bit in memory with any data placed in a comparand register. A match flag is asserted to allow a user to know that the data is in memory. Priority encoders sort the matching locations by priority and make address matching location available to a user.

As compared to more standard memory address circuits, in a Content Addressable Memory circuit, data is supplied and an address obtained, and thus, address lines are not required. A router address look-up search examines a destination address for incoming packets and examines the address look-up table to find an appropriate output port. This algorithm and circuitry involves longest-prefix matching and uses the Internet Protocol (IP) networking standard in most cases.

Current routing tables have about 30,000 entries or more and the number of entries is increasing rapidly. Terabit-class routers perform hundreds of millions of searches per second and update routing tables thousands of times per second. Because of present and future projected routing requirements, Content Addressable Memory circuits are used to complete a search in a single cycle. In these circuits, comparison circuitry is usually added to every CAM memory cell, forming a parallel look-up engine. The CAM memory cells can be arranged in horizontal words, such as four horizontal words that are each five bits long, for example. The memory cells contain both storage and comparison circuitry. Search lines run vertically and broadcast search data to the CAM memory cells. Match lines run horizontally across the array and indicate whether a search data matches the word in the row. An activated match line indicates a match, and a deactivated match line indicates a non-match or mismatch. The match lines are input to the priority encoder, which generates an address corresponding to a match location.

Typically, a search will begin by precharging high all match lines in a matched state. Data is broadcast by drivers onto search lines. The CAM cells compare the stored bit against a bit on corresponding search lines. Any cells that match data do not affect match lines, but any cells with a mismatch would pull-down a match line for any word that has at least one mismatch. Other match lines are activated and pre-charged high.

The priority encoder will generate a search address location for any matching data. For example, an encoder could select numerically the smallest numbered match line for two activated match lines and generate a match address, for example 01. This can be input to a RAM that contains output ports. The match address output is a pointer that retrieves associated data from RAM. An SRAM cell could include positive feedback in a back-to-back inverter with two access transistors connecting bit lines to storage nodes under control of a word line. Data is written or read into and from a cell through the bit lines. Mismatches occur quite often and typically only a small number of matches occur, and the circuit function results in high power consumption on match lines.

The circuit can be arrayed to handle a number of binary divisible row locations. A column structure can be hierarchical in nature. In a CAM circuit, it is sometimes necessary to encode one or more row locations. Because only one location can typically be encoded at a time, the locations are prioritized and the highest priorities are encoded. The priority can be set based on a physical order. Devices made from CAM circuits also typically require a physical prioritization. Usually a priority encoder is done with many stages of combinational logic.

In commonly assigned U.S. Pat. No. 6,678,184, the disclosure which is hereby incorporated by reference in its entirety, the CAM circuit has a reduced semiconductor substrate area to provide an increase in performance and improves packing density to make router designs smaller and more efficient. The reduction of substrate area is accomplished by the unique placement, organization, and interconnection of transistors in the CAM circuit. As disclosed, the CAM circuit is in a semiconductor substrate and includes a match signal output having a logical state set to a first value. The compare circuit compares a stored data value to an input compare data value having an enable input. A matched output is coupled to the matched signal output and a compare data input is coupled to a compare data signal and a stored data input. If the enable input receives an enable true signal and a stored data input receives a stored data signal, and the compare data false input receives a compare data signal, then the logical state of the matched signal output changes to a second value to indicate no match. As also disclosed, a first data storage device stores the data value having first and second word lines, first and second bitlines, a stored data output, and a first conductive strip electrically coupling the stored data output to the stored data input of the compare circuit. The stored data output provides the stored data signal. The first word line of the first data storage device is formed in a first conductive region and a second word line of the first data storage device is formed physically separate and distinct from the first conductive region in a second conductive region. The second data storage device has a memory cell storing an enable value having first and second word lines, first and second bitlines, and an enable output. A second conductive strip electrically couples the enable output to the enable input of the compare circuit. The enable output provides the enable true signal.

Although this design provides for an increase in performance and improves the packing density of the CAM circuit, the memory cell stability is not robust. Alpha or similar atomic particles can cause shorts and memory cell instability.

SUMMARY OF THE INVENTION

The Content Addressable Memory (CAM) circuit of the present invention has at least one capacitor added between internal nodes of memory cells and a common terminal for added memory cell stability.

In accordance with the present invention, the CAM circuit includes a plurality of memory cells, each having two internal nodes and a common terminal used for another memory cell. A compare circuit is operative with the memory cells. At least one capacitor and preferably two are added between the internal nodes (true and complement) of the memory cell and the common terminal formed as a plate for memory cell stability. The memory cell is formed as a Static Random Access Memory (SRAM) circuit. In one aspect of the invention, two capacitors for each cell are added between the internal nodes of the memory cells and common terminal. A semiconductor layer can be common to the capacitors to provide a plate voltage and the compare circuit can be formed as two active regions. A plurality of transistors can be formed over the two active regions.

In another aspect of the present invention, a polysilicon region forms a local interconnect between the compare circuit and first memory cell. A polysilicon and conductive region can form a local interconnect between the compare circuit and a second memory cell. A common terminal for first and second memory cells can have a voltage potential of about one-half the high voltage potential for the memory cells.

A metallization layer can form word lines and another metallization layer can form bitline and compare lines. Ground lines can also be formed within the metallization layer having the bitline and compare lines. The bitlines can be formed as bitline true and bitline false lines and the compare lines can be formed as compare true and compare false lines.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
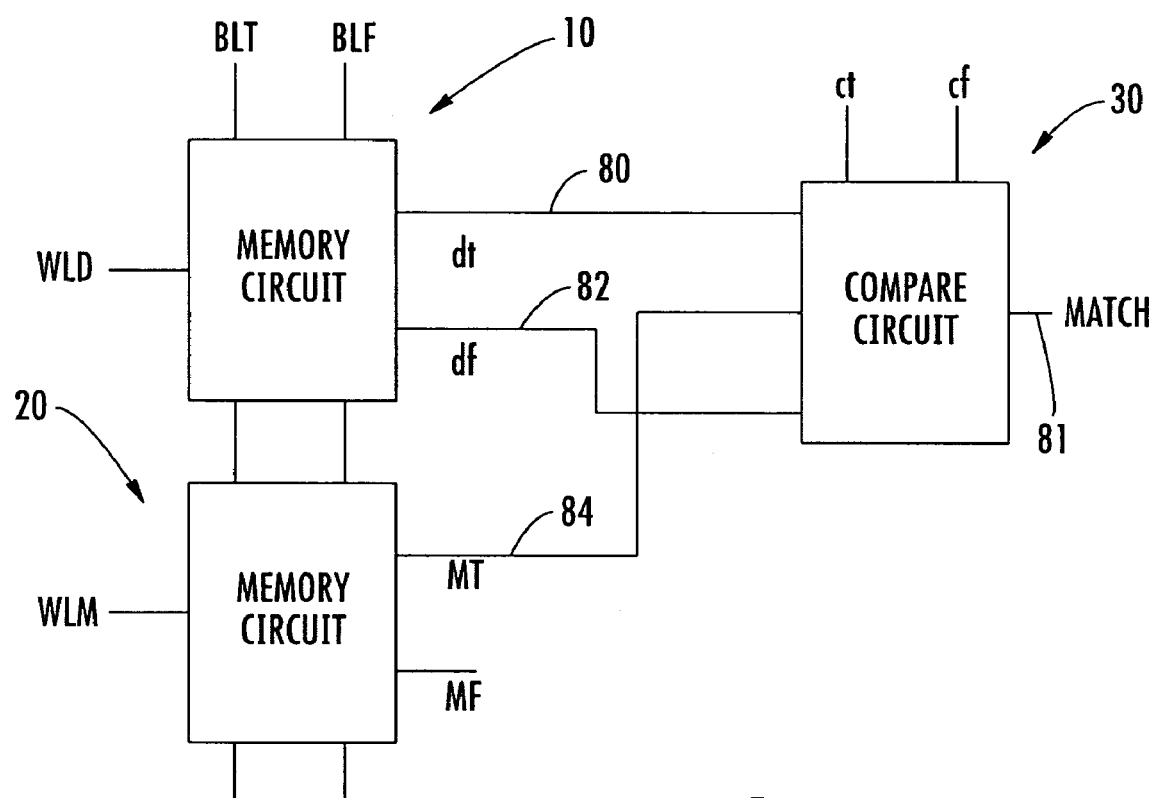
FIG. 1 is a schematic block diagram showing a CAM circuit of the prior art as described in the incorporated by reference U.S. Pat. No. 6,678,184.
Figure 2:
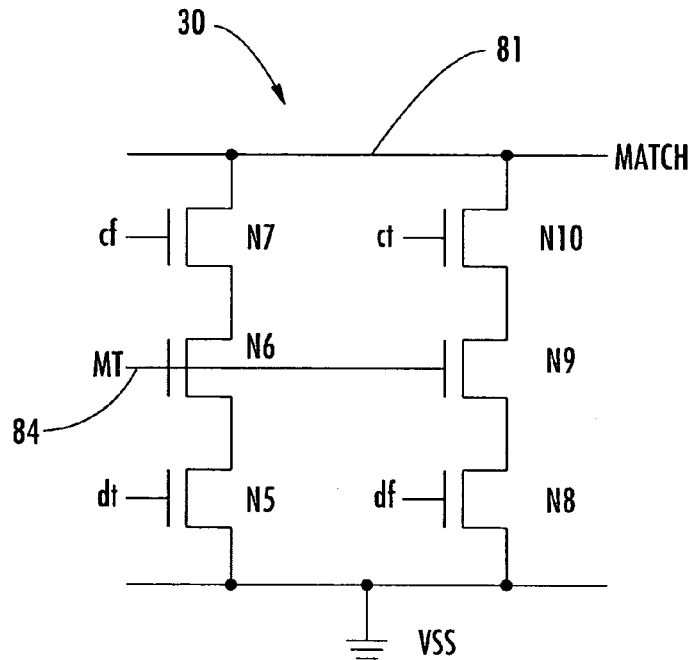
FIG. 2 is a schematic circuit diagram of the compare circuit shown in FIG. 1.
Figure 3:
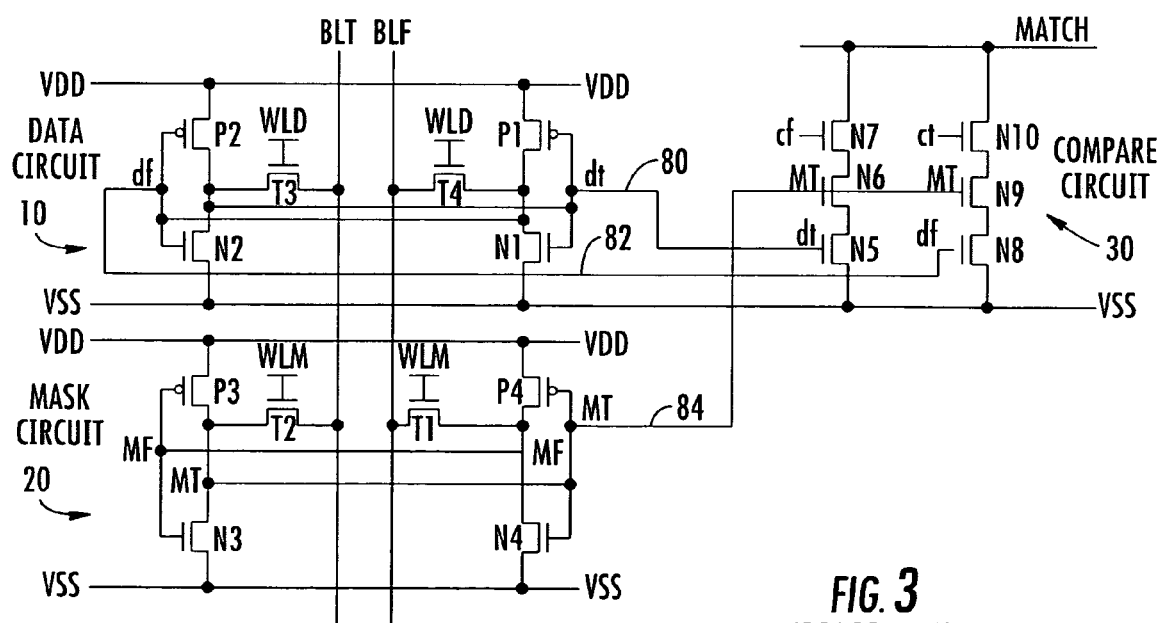
FIG. 3 is a schematic circuit diagram of the transistors and their connections in the CAM circuit shown in FIG. 1.

The present invention provides a Content Addressable Memory (CAM) circuit that has improved memory cell stability against alpha and similar atomic particles. The circuit incorporates at least one added capacitor between internal nodes of memory cells and a common terminal VPL allowing a common plate voltage to the capacitors. The added capacitors add robustness to memory cell stability from alpha and similar atomic particles. The present invention is similar in design, but an improvement of the transistor CAM circuit disclosed in the incorporated by reference and commonly assigned U.S. Pat. No. 6,678,184. This prior art CAM circuit is shown in FIGS. 1–3, and labeled "Prior Art." For purposes of description, the CAM circuit disclosed in this incorporated by reference '184 patent is described relative to FIGS. 1–3. That description is followed by a description of the present invention. Details of the processing of that prior art CAM circuit shown in FIGS. 1–3 are set forth in further detail in the '184 patent.

FIG. 1 shows a first memory cell 10, a second memory cell 20, and a compare circuit 30 forming a CAM cell, i.e., CAM circuit. The first and second memory cells 10, 20 are used to store a data value and a mask value, respectively. The mask value is the enable or disable signal provided to the compare circuit 30, which are shown in FIG. 1, compares the stored data value in the first memory cell 10 to input data signals cf and ct. When the second memory cell 20 has stored an enable value, the true mask signal enables the compare circuit 30 to permit a comparison to occur. When a disable value has been stored, the true mask signal disables the compare circuit 30 so a comparison does not occur. The match line provides an output of the results of the comparison. When the compare circuit is enabled and there is a match between the stored data and the compare data, the match line state remains in the same state, staying high or staying low. When the compare circuit is enabled and there is not a match, the state of the match line is changed, going from high to low.

If any one CAM cell of the many connected to a match line is not a match, the line will be pulled low. If n-channel transistors are used for the compare circuit, the line will transition from high to low. The signal line 80 provides the interconnection from the first memory cell 10 to the compare circuit 30 for the data-true signal. The signal line 82 provides the interconnection from the memory cell 10 to the compare circuit 30 for data-false signal. The mask-true data is provided on signal line 84 from the second memory cell 20 to the compare circuit 30 and the mask-false data is not output from the second memory cell 20 because in this particular embodiment there is no use of the mask-false signal in the compare circuit 30. In an alternative design, the mask-false signal may be used. However, in the illustrated design, the compare circuit 30 is constructed to permit enabling or disabling of the cell based solely on the signal value of the mask-true output from the second memory cell 20 so that the mask-false output is not needed.

FIG. 2 is a schematic circuit diagram of the compare circuit 30 of FIG. 1. In the embodiment of FIG. 2, six transistors are used, N5–N10, in order to provide the compare function of the compare circuit 30 of FIG. 1. In this embodiment, as shown, all of the transistors are n-channel transistors and the description follows with an assumption that n-channel transistors are used in the compare circuit. Alternative embodiments may use other transistor types. For example, p-channel transistors could be used for some, or all, of the transistors and the appropriate signal levels would be reversed for those p-channel transistors as well as the respective connections to ground and power as such is considered equivalent and easily accomplished by those of skill in the art.

In the schematic circuit diagram of FIG. 3, the mask-true signal line 84 is provided to two transistors, N6 and N9, to provide the disable and enable function. When the mask-true signal on line 84 is high, the compare circuit 30 is enabled with both transistors N6 and N9 turned on to permit the comparison to occur. On the other hand, when the signal on line 84 is low, the transistors N6 and N9 are disabled so that a comparison between the stored data and the compare data cannot occur. In this particular embodiment, the match disable transistors are positioned between the respective compare transistors and the data transistors to provide two separate series chains between the match line and ground line, both of which include a respective match disable transistor. This particular transistor structure thus provides completely independent and individualized path from the match data signal line to ground. It should be understood that the circuit shown in the schematic circuit diagram of FIG. 3 is laid out in silicon as further explained in the incorporated by reference '184 patent.

The schematic circuit diagram of the entire CAM circuit of FIG. 1 is shown in FIG. 3. The first memory cell 10 is a data cell that stores a data value. The second memory cell 20 is a mask cell that stores a mask value. The first memory cell 10 comprises transistors P1, N1, T4, T3, N2, and P2. The second memory cell 20 comprises transistors N4, P4, T1, T2, N3, and P3. The compare circuit 30 comprises transistors N5–N10.

As shown in FIG. 3, the first memory cell 10 is used to store a data value, and is thus labeled as a data circuit. The stored data value is then compared to an input data value by the compare circuit 30. The first memory cell 10 is electrically connected as a standard six-transistor, full CMOS SRAM cell. The gate of the second pull-down transistor N2 of the first memory cell 10 is electrically coupled to the gate of the second pull-up transistor P2, to the drain region of the first pull-down transistor N1, to the drain region of the first pull-up transistor P1, to the drain region of the first pass transistor T4 and to the gate of the data-false transistor N8 of the compare circuit 30, thereby defining the data-false df node 82. The gate of the first pull-down transistor N1 of the first memory cell 10 is electrically coupled to the gate of the first pull-up transistor P1, to the drain region of the second pull-down transistor N2, to the drain region of the second pull-up transistor P2, to the drain region of the second pass transistor T3 and to the gate of the data-true transistor N5 of the compare circuit 30, thereby defining the data-true dt node 80. The first pass transistor T4 of the first memory cell 10 has a gate electrically coupled to a first word line signal WLD and has a source region electrically coupled to a false bit line signal BLF. The second pass transistor T3 of the first memory cell 10 has a gate electrically coupled to the first word line signal WLD and has a source region electrically coupled to a true bit line signal BLT.

As shown in FIG. 3, the second memory cell 20 is used to store a mask value MT and is thus labeled as a mask circuit. The mask value MT of node 84 enables or disables the compare circuit 30. The second memory cell 20 is also a standard 6-transistor full CMOS SRAM cell. The gate of the second pull-down transistor N3 of the second memory cell 20 is electrically coupled to the gate of the second pull-up transistor P3, to the drain region of the first pull-down transistor N4, to the drain region of the first pull-up transistor P4, and to the drain region of the first pass transistor T1, thereby defining the mask-false MF node. The gate of the first pull-down transistor N4 of the second memory cell 20 is electrically coupled to the gate of the first pull-up transistor P4, to the drain region of the second pull-down transistor N3, to the drain region of the second pull-up transistor P3, to the drain region of the second pass transistor T2, and to the gates of the first and second enable transistors N6 and N9 of the compare circuit 30, thereby defining the mask-true MT node 84. The first pass transistor T1 of the second memory cell 20 has a gate electrically coupled to the second word line signal WLM, and a source region electrically coupled to the false bit line signal BLF. The second pass transistor T2 of the second memory cell 20 has a gate electrically coupled to the second word line signal WLM, and a source region electrically coupled to the true bit line signal BLT.

In the embodiment just described, the memory cells 10 and 20 are both SRAM memory cells of the six-transistor type. The SRAM memory cells can also be of the four-transistor type. Thus, a four-transistor memory cell using two polysilicon load resistors as the load devices may be used in place of each of the respective six-transistor cells as described in FIG. 3. In a further alternative embodiment, each of the memory cells 10 and 20 is composed of another acceptable memory cell. For example, they may be composed of an EEPROM, EPROM, ROM, flash memory cell, or other acceptable volatile or nonvolatile memory cell. Other types of data storage or organization may also be used including DRAMS, blown fuses, programmed ROMS, or other acceptable storage devices for the memory cells 10 and 20. The outputs of the respective memory cells 10 and 20 shown in FIG. 1 are therefore provided to the compare circuit 30 as shown in FIG. 1 and regardless of the particular type, arrangement, or structure of the particular memory inside each of the respective cells.

As shown in FIG. 3, the compare circuit 30 is used to compare a stored data value provided by signals dt of interconnect 80 and df of interconnect 82 in the first memory cell 10 to an input data value of signals cf and ct. In a preferred embodiment, the compare circuit 30 is organized as two parallel stacks of N-type transistors, N5–N10. The compare-false transistor N7 has a gate electrically coupled to an input signal cf, a source region electrically coupled to the drain region of the first enable transistor N6, and a drain region electrically coupled to the MATCH signal. The compare-true transistor N10, has a gate electrically coupled to an input signal ct, a source region electrically coupled to the drain region of the second enable transistor N9, and a drain region electrically coupled to the MATCH signal. The first enable transistor N6 has a source region electrically coupled to the drain region of the data-true transistor N5. The second enable transistor N9 has a source region electrically coupled to the drain region of the data-false transistor N8. The organization of the transistors of the compare circuit has the advantage of reducing the substrate area utilization of the CAM cell.

Referring now to FIGS. 4–22, details of the CAM circuit 100 of the present invention and its fabrication are illustrated. To facilitate understanding and description, reference numerals begin in the 100 series. It should be understood, however, that many components described relative to FIGS. 1–3 are substantially similar to many components described with reference to FIGS. 4–22.

Figure 4:
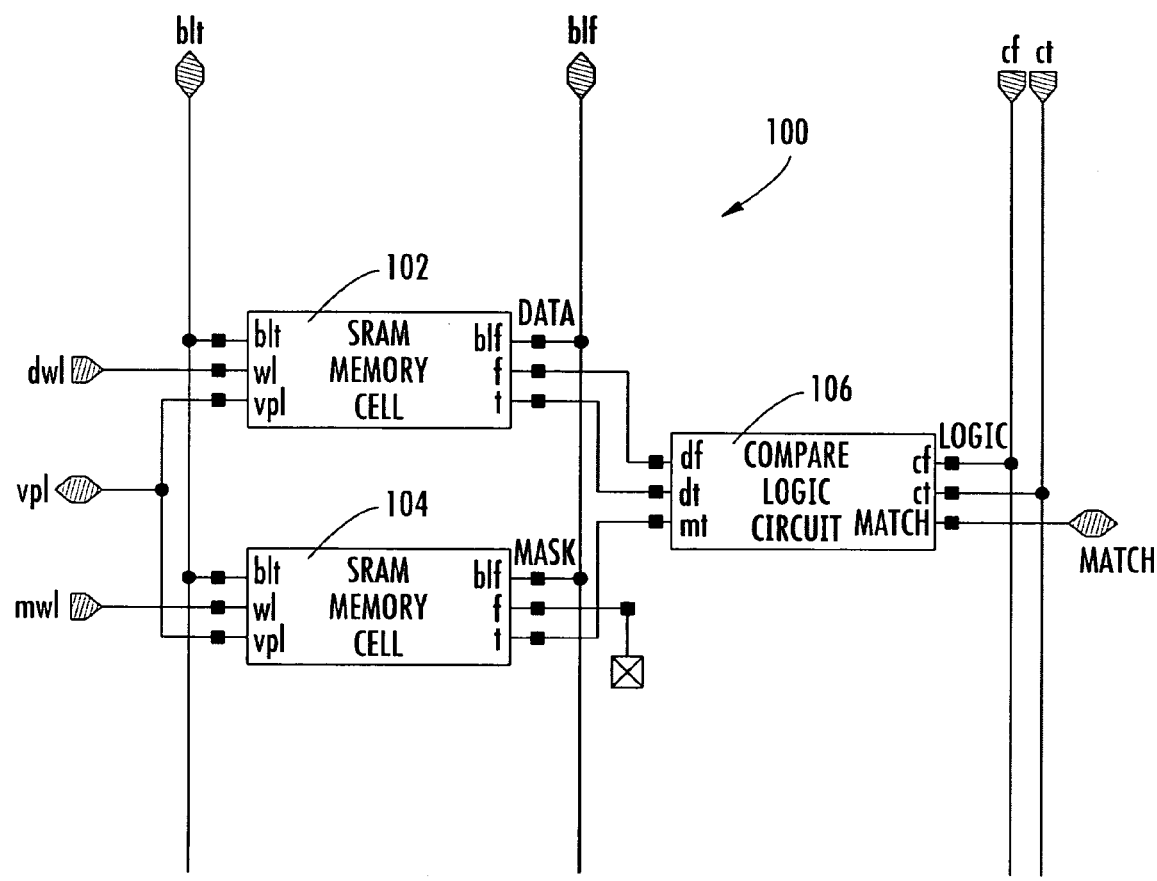
FIG. 4 is a block schematic circuit diagram of the CAM circuit of the present invention and showing in block format two SRAM memory cells and a compare or logic circuit.

FIG. 4 is a schematic block diagram of the CAM circuit 100 of the present invention showing the two SRAM memory cells 102, 104 and the compare (or logic) circuit 106. The circuits are connected together with appropriate circuit lines as illustrated. FIG. 4 shows the bitline true (blt), bitline false (blf), compare false (cf) and compare true (ct) lines and terminals. The appropriate memory cells 102, 104 and compare circuit 106 are connected to these lines in the manner as shown. The matched circuit line and terminals are shown connected to the compare (logic) circuit 106. The VPL terminals and inputs have a plate voltage for the capacitor and form a common terminal connected to the first and second memory cells 102, 104 as illustrated. The word line is shown connected to the memory cells as illustrated.

Figure 5:
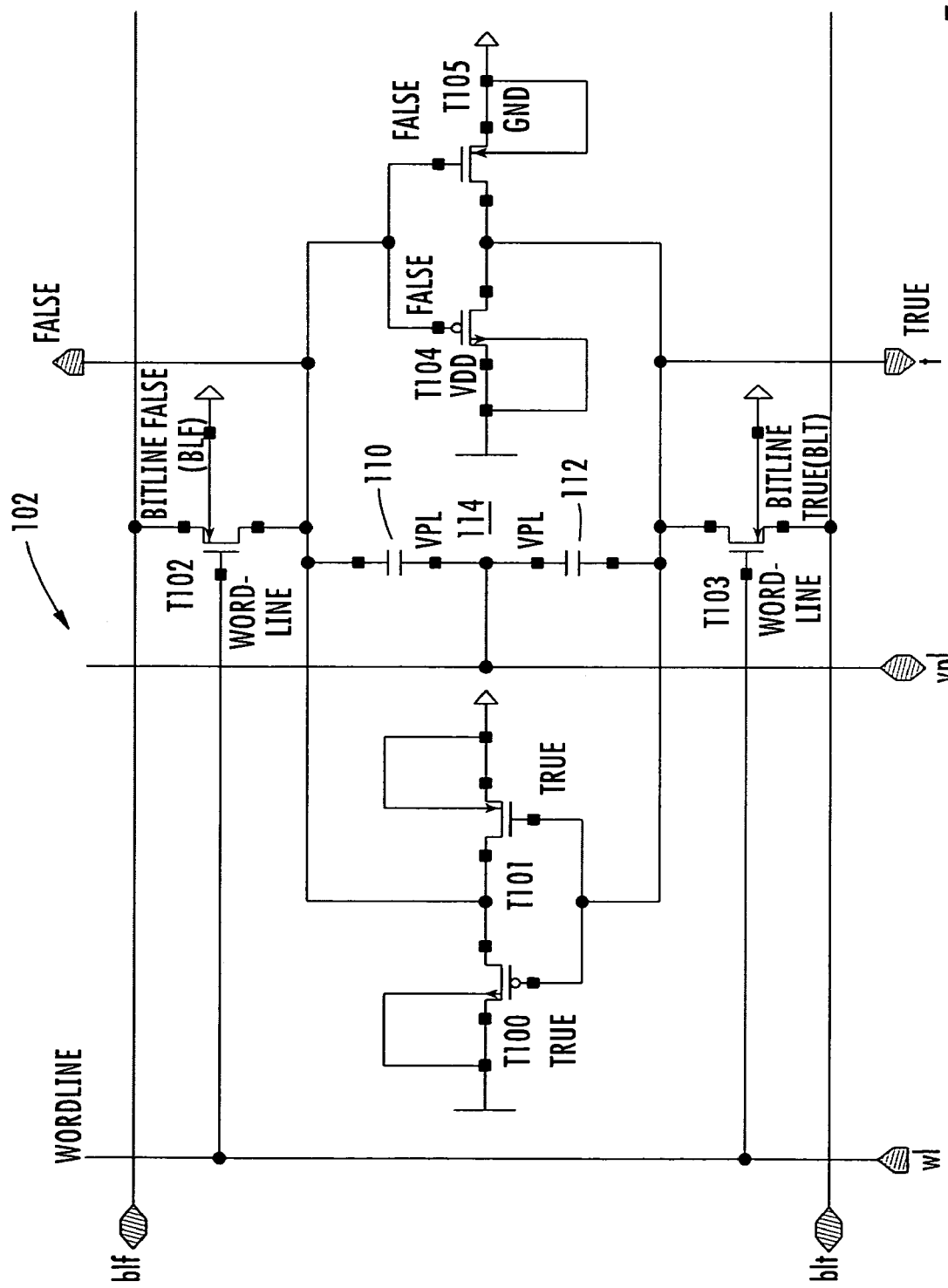
FIG. 5 is a schematic circuit diagram of a SRAM cell shown in FIG. 4, in accordance with the present invention.

FIG. 5 is a schematic block diagram of an SRAM memory cell 102, such as shown in FIG. 4, and showing six transistors T100–T105, and the common terminal VPL connected to two capacitors 110, 112 as illustrated. VPL is a common node 114 and corresponds to a capacitor plate layer that runs throughout the array. It is preferably at one potential. It could have a voltage value of about Vdd/2, and thus VPL is about 0.5 the Vdd voltage. Because the capacitors 110, 112 are implemented in the CAM circuit of the present invention, the voltage "inertia" is maintained. The capacitors 110, 112 provide a large amount of capacitance associated with the memory cells and will hold the internal loads of the memory cells. A steady state circuit is accomplished because the capacitance adds memory cell stability against alpha and similar atomic particles that could create circuit shorts. Capacitor values can, of course, be chosen based upon the type of memory cell and the type of compare or logic circuit used in the present invention.

Figure 6:
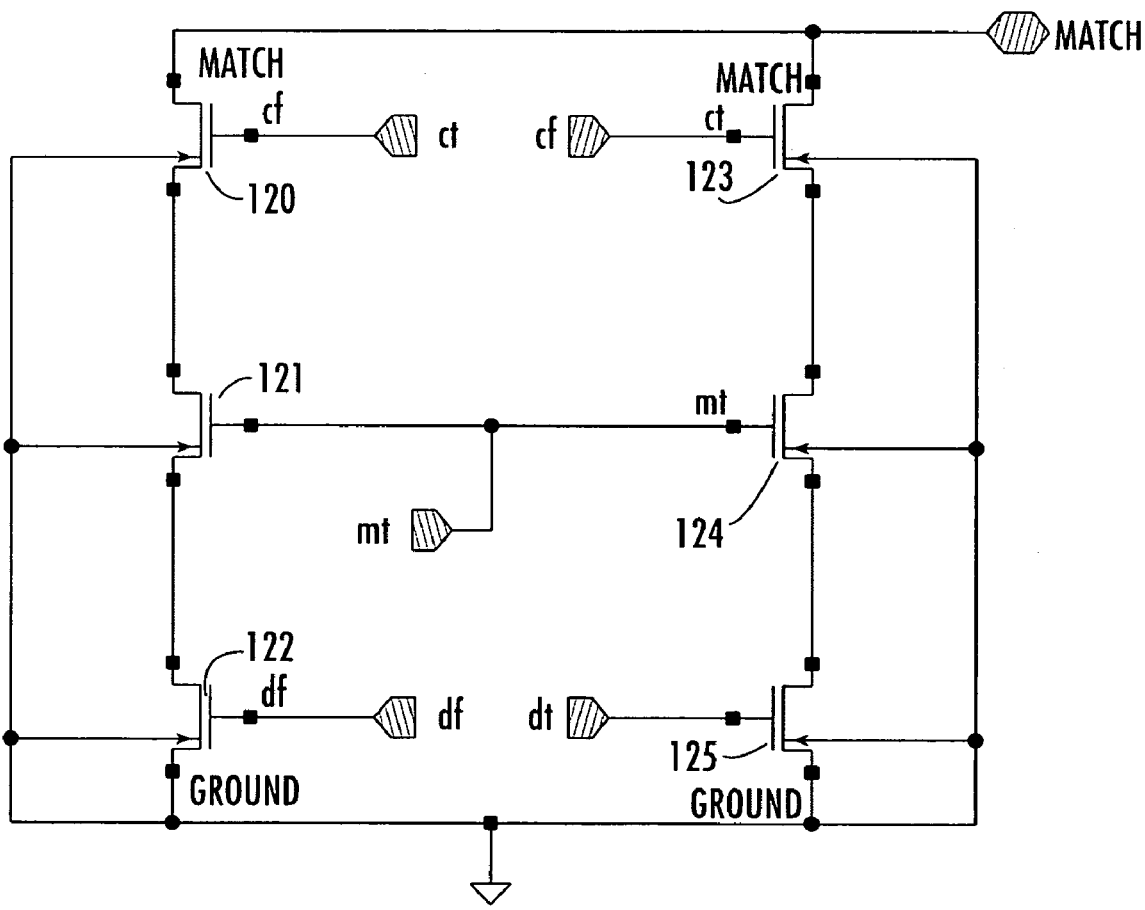
FIG. 6 is a schematic circuit diagram of the compare or logic circuit shown in FIG. 4, in accordance with the present invention.

FIG. 6 is a schematic circuit diagram of the compare or logic circuit 106 that can be used in the present invention and showing six transistors 120–125 used in this circuit and showing the various data false (df), data true (dt), match, including mask-true (mt), compare true (ct) and compare false (cf) lines and associated terminals.

Referring now to FIGS. 7–22, an overview of the semiconductor processing steps that can be used for forming the CAM circuit 100 of the present invention are illustrated with a rectangular alignment graphic 200 configuration common to all drawings indicating the cell boundary configuration that will have added layers. All fabrication steps are, of course, not necessarily illustrated.

Figure 7:
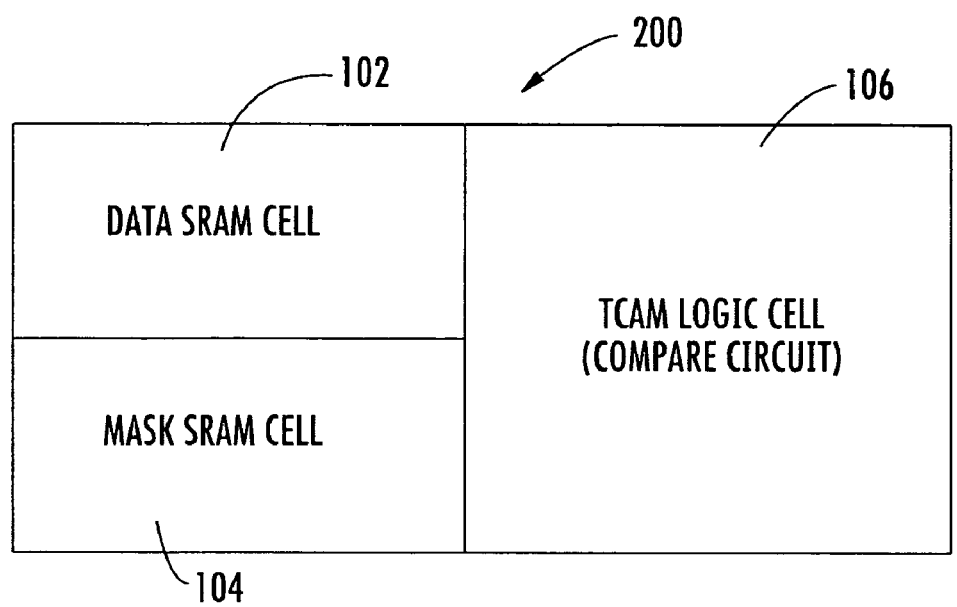
FIG. 7 is a block diagram showing the layout of the DATA SRAM memory cell, Mask SRAM memory cell, and TCAM logic or compare circuit in a semiconductor substrate, in accordance with the present invention.

FIG. 7 shows the layout of the CAM circuit in the semiconductor substrate 200 and showing the data SRAM memory cell 102, mask SRAM memory cell 104, and TCAM logic cell or compare circuit 106.

Figure 8:
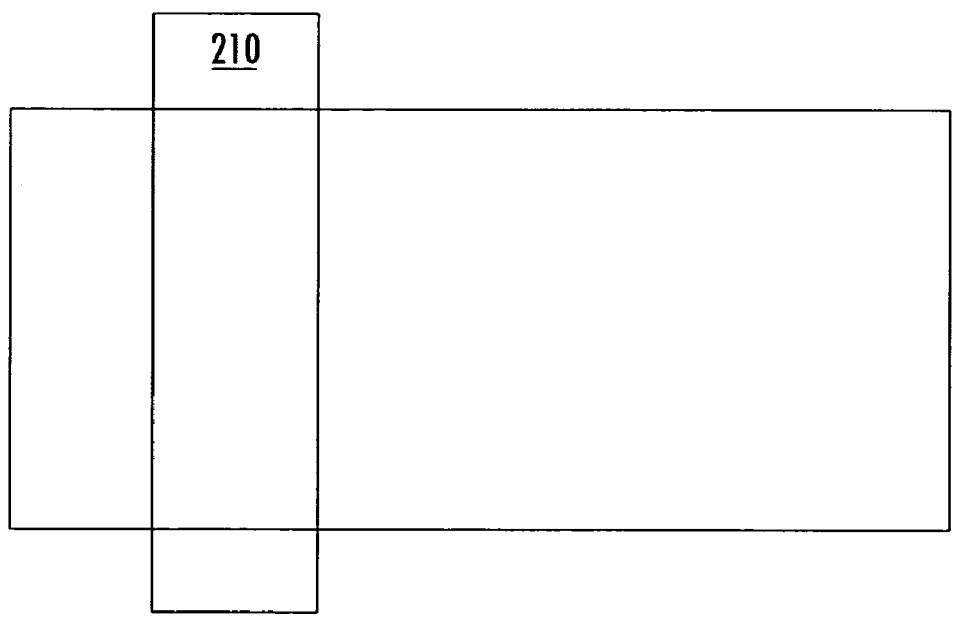
FIG. 8 is a graphic showing the layout of an N-well for a P-substrate type process for fabricating the CAM circuit of the present invention.

FIG. 8 shows a P-substrate type process and the formation of an N-well 210 shown as the vertical rectangle on the left side for the data SRAM cell 102 and mask SRAM cell 104.

Figure 9:
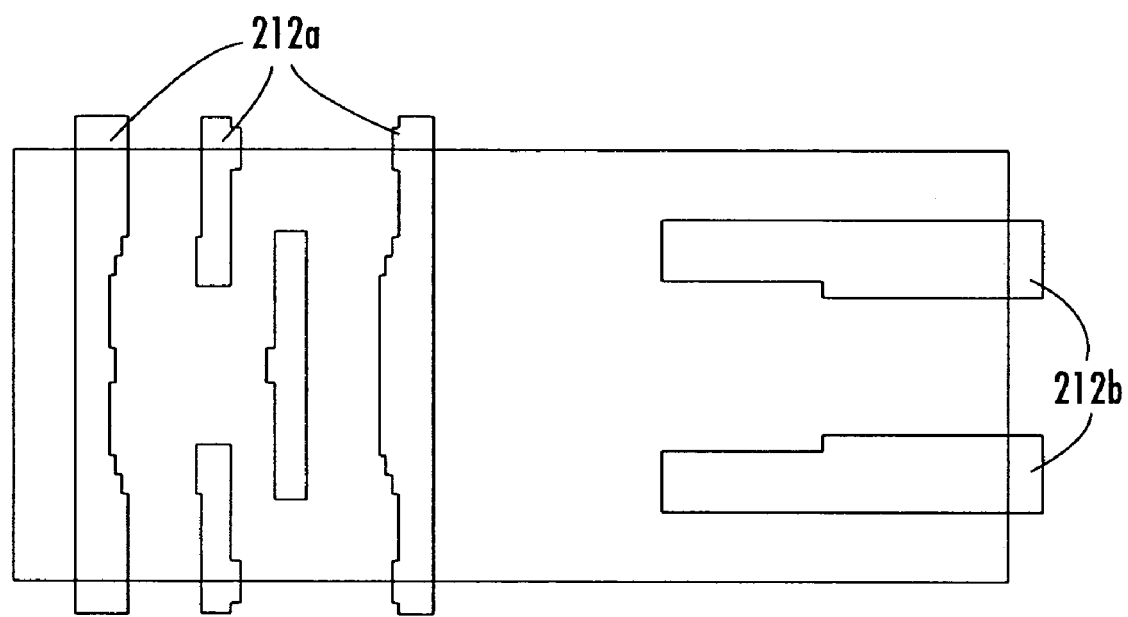
FIG. 9 is a graphic showing the layout of active portions to form transistors for the memory cells of the present invention.

FIG. 9 shows the addition of an active layer that will establish the transistors. The vertical strips 212a on the left are used at the two SRAM cells and the horizontal strips 212b are used at the matched lines and logic or compare circuits.

Figure 10:
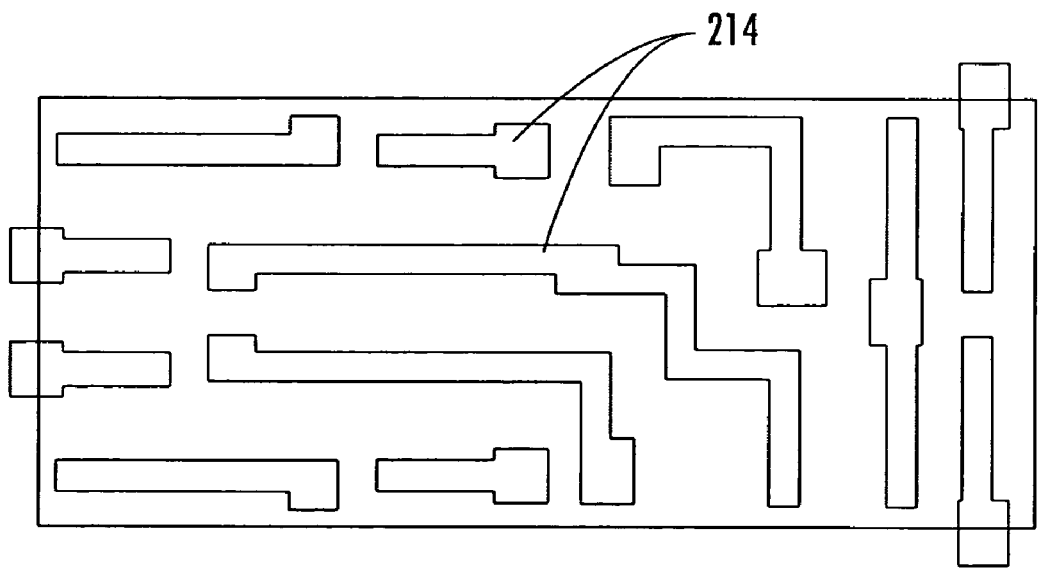
FIG. 10 is a graphic showing the layout of a polysilicon layer forming the gates of the transistors and associated interconnects of the present invention.

FIG. 10 shows the addition of a polysilicon layer 214 forming gates of transistors and some interconnects.

Figure 11:
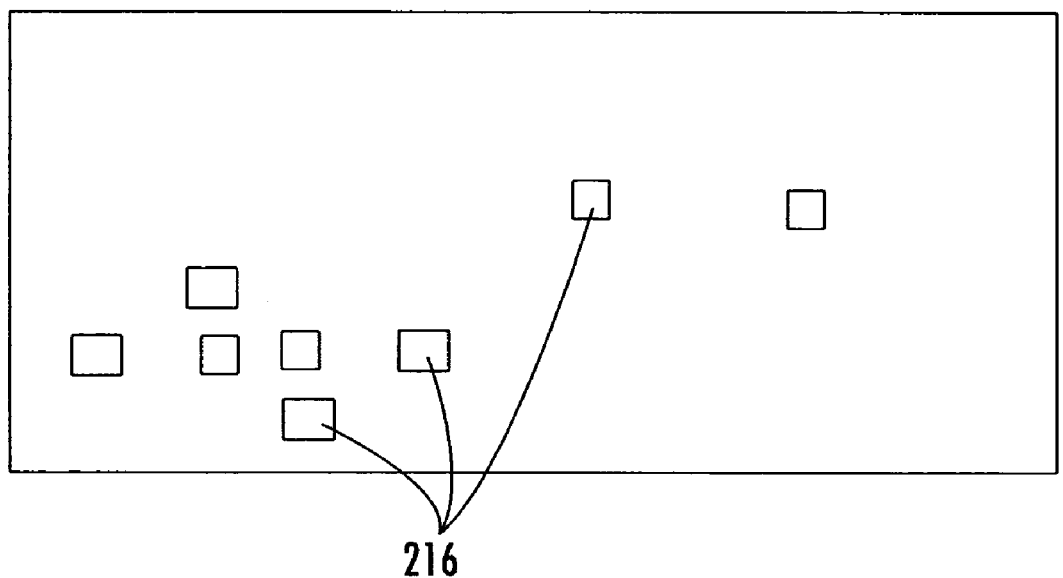
FIG. 11 is a graphic showing the formation of a local interconnect level (LIL) also as a wiring layer of the present invention.

FIG. 11 shows the addition of a local interconnect level 216 shown as small rectangular boxes operative similar to contacts and also incorporating a wiring layer for purposes of connecting one layer to another layer.

Figure 12:
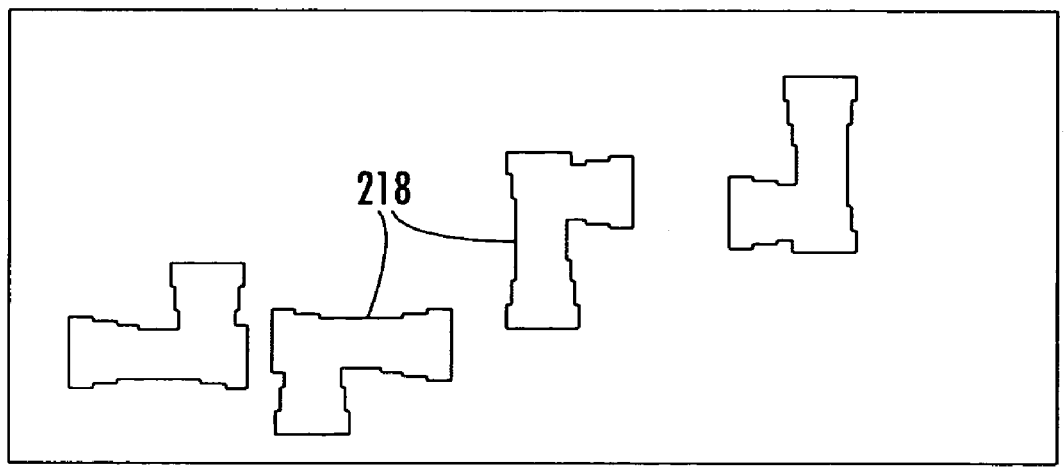
FIG. 12 is a graphic showing the layout of a first capacitor layer that could be connected to internal nodes of memory cells of the present invention.

FIG. 12 shows a first capacitor layer 218 that could be connected to internal nodes of both SRAM memory cells. The bottom left two shapes are operative with the mask SRAM cell, and access to any nodes in a logic or compare circuit can be provided by the other two layered shapes on the right. The right two capacitor layers are connected to the SRAM internal nodes. It is convenient to make the connection over the compare logic area because "dt" and "df" are routed to that location.

Figure 13:
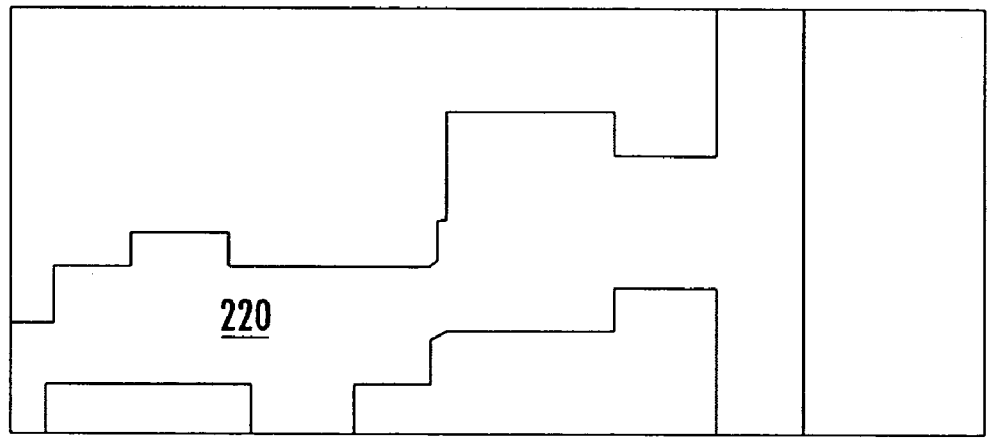
FIG. 13 is a graphic showing the layout of a second capacitor layer that forms a common plate to carry a voltage (VPL) for the capacitors of the present invention.

FIG. 13 shows a next layer as a second capacitor layer 220 and forms a common layer for the capacitors and the VPL node as shown in the schematic circuit diagram of FIG. 5. This is a common layer allowing the common capacitor plate voltage as described before. It should be understood that the semiconductor fabrication process as described can be used with modification for the 18 transistor CAM circuit shown in FIGS. 1–3, and also, of course, described relative the invention shown in FIGS. 4 and 5.

Figure 14:
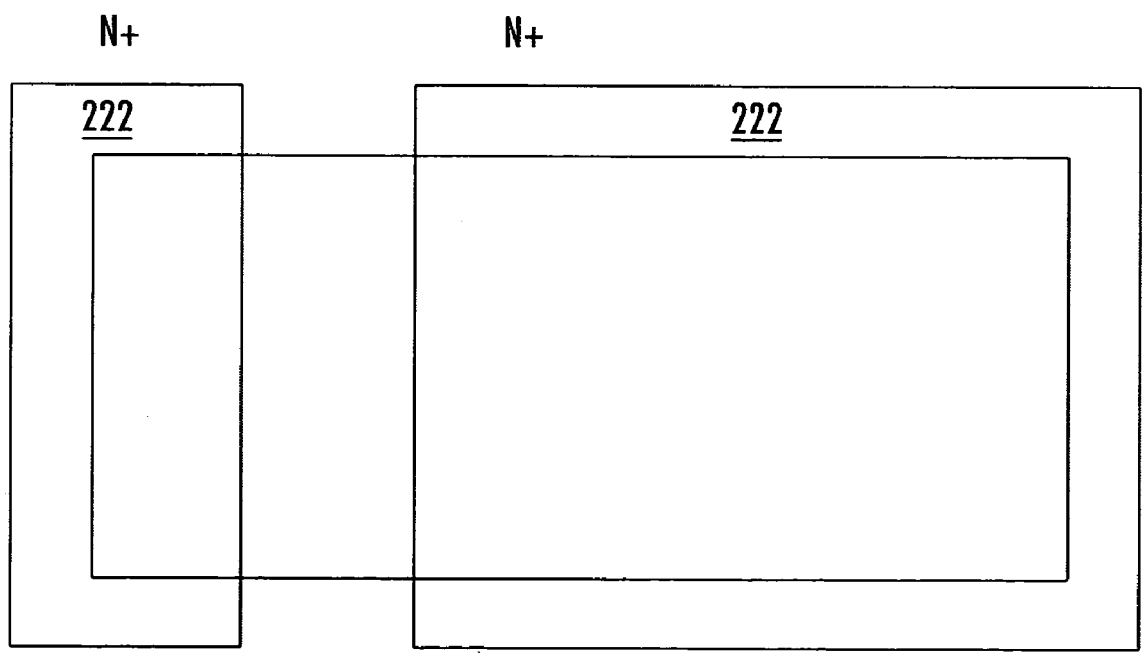
FIG. 14 is a graphic showing the layout of an implant layer to determine whether there would be a P-channel or N-channel type circuit and resistor, and showing an N+ polarity fabrication of the present invention.
Figure 15:
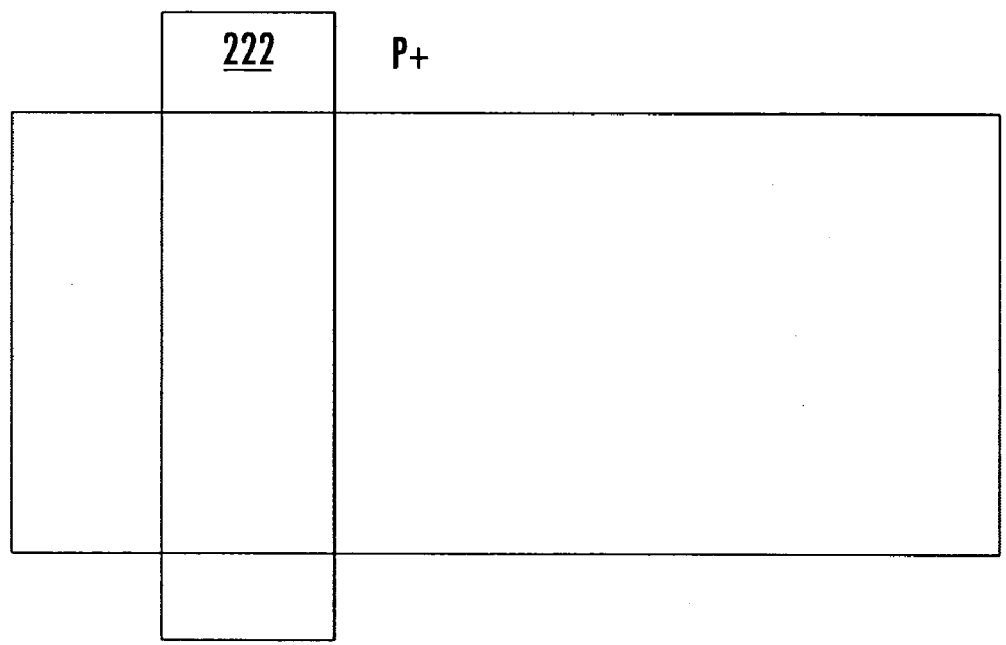
FIG. 15 is a graphic showing a P+ polarity fabrication of the present invention, opposite of the N+ polarity fabrication shown in FIG. 14.

FIG. 14 shows an implant layer 222 that can be used to determine whether there would be a P-channel or N-channel type resistor and circuit, and showing in FIG. 14 an N+ fabrication, while FIG. 15 shows a P+ fabrication opposite to FIG. 14.

Figure 16:
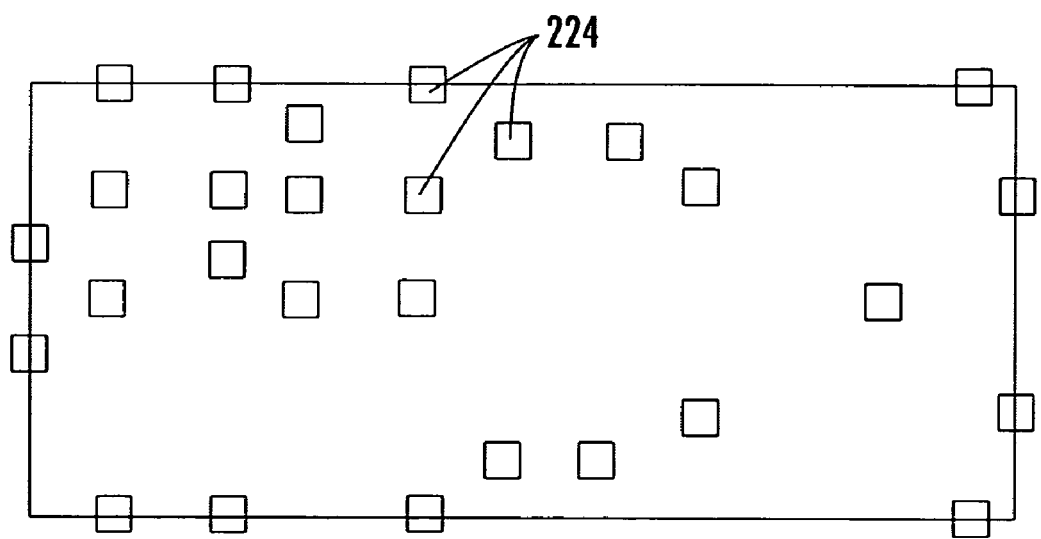
FIG. 16 is a graphic showing the formation of a contact layer that could connect metal, active, or polysilicon regions and/or layers of the present invention.

FIG. 16 shows an added layer for different contacts 224 that can be added to connect metal, an active layer, or polysilicon.

Figure 17:
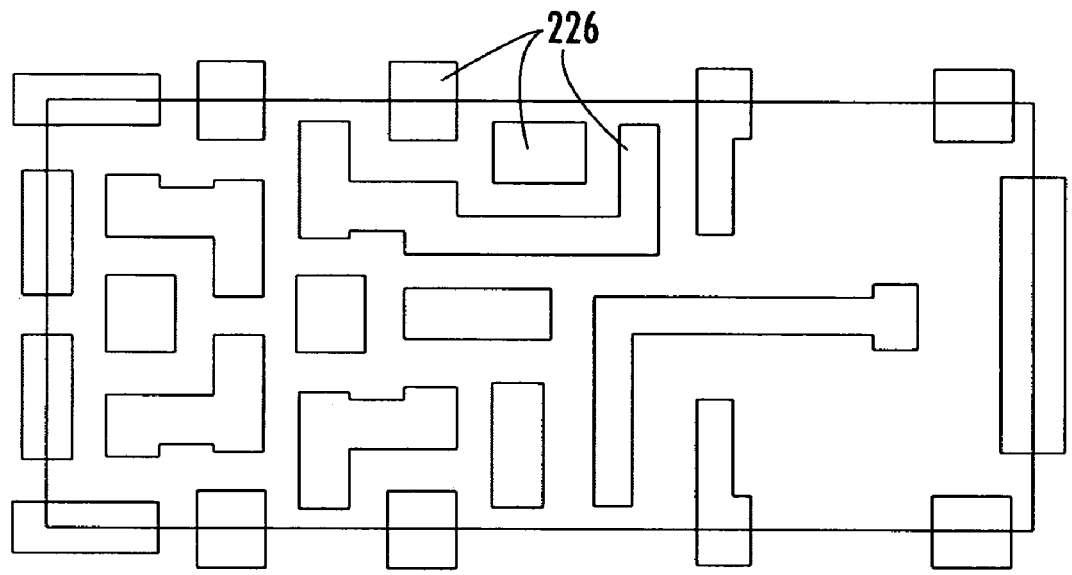
FIG. 17 is a graphic showing the layout of a first metal layer for interconnects of the present invention.
Figure 18:
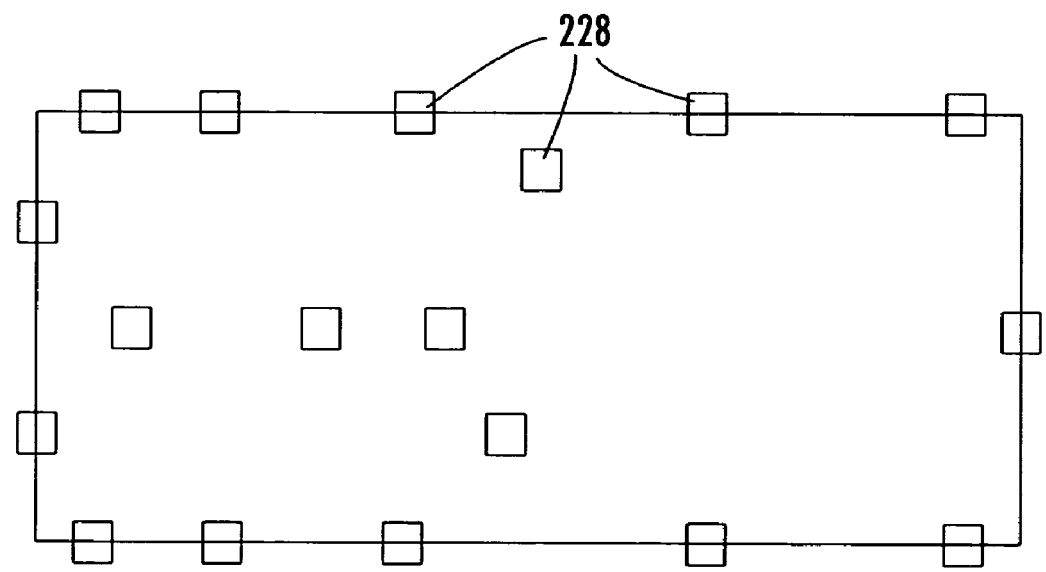
FIG. 18 is a graphic showing the layout of first vias that will connect the two metal layers shown in FIGS. 10 and 11.
Figure 19:
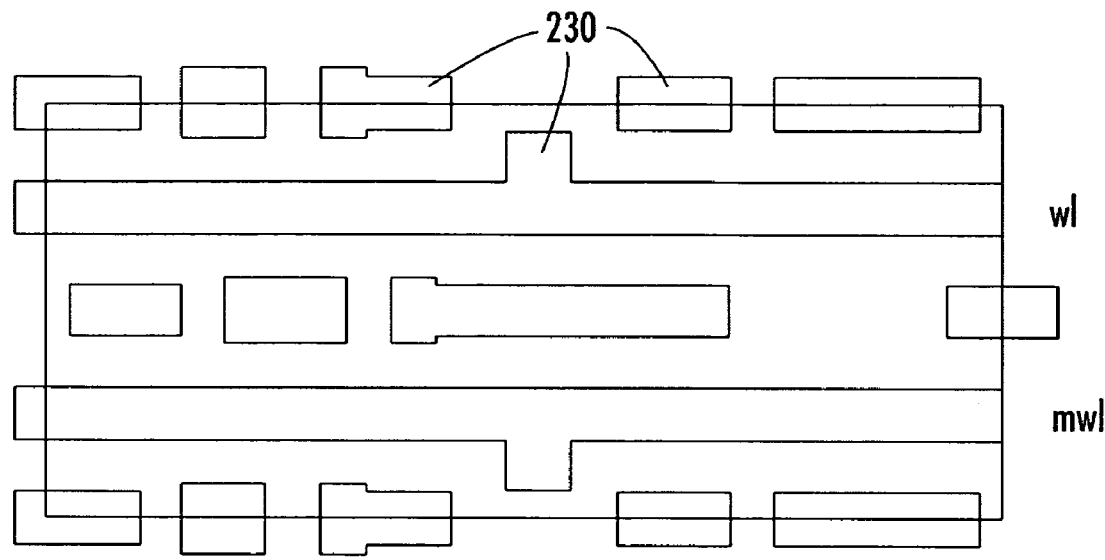
FIG. 19 is a graphic showing the layout of a second metal layer for a word line and word line mask lines of the present invention.

FIG. 17 shows a metal interconnect layer 226 and FIG. 18 shows a via interconnect layer 228 that could connect a metal interconnect layer 226 shown in FIG. 17 to a metal layer 230 shown in FIG. 19, which is also used to add a word line (wl) and mask word line (mwl) as shown. This forms the word lines for the SRAM memory cells and permits enabling of the memory cells.

Figure 20:
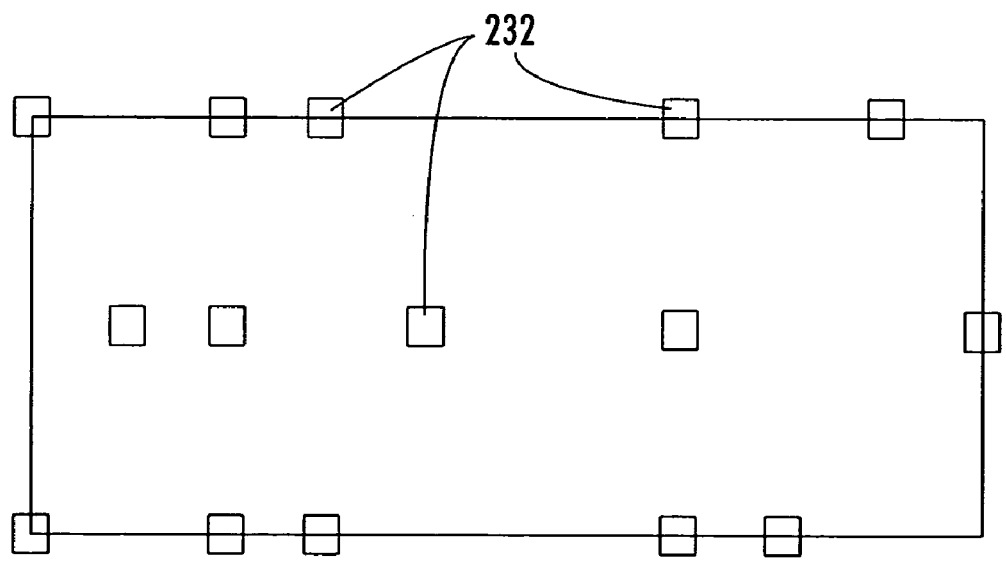
FIG. 20 is a graphic showing the layout of first vias that connect up to a metal layer of the present invention.
Figure 21:
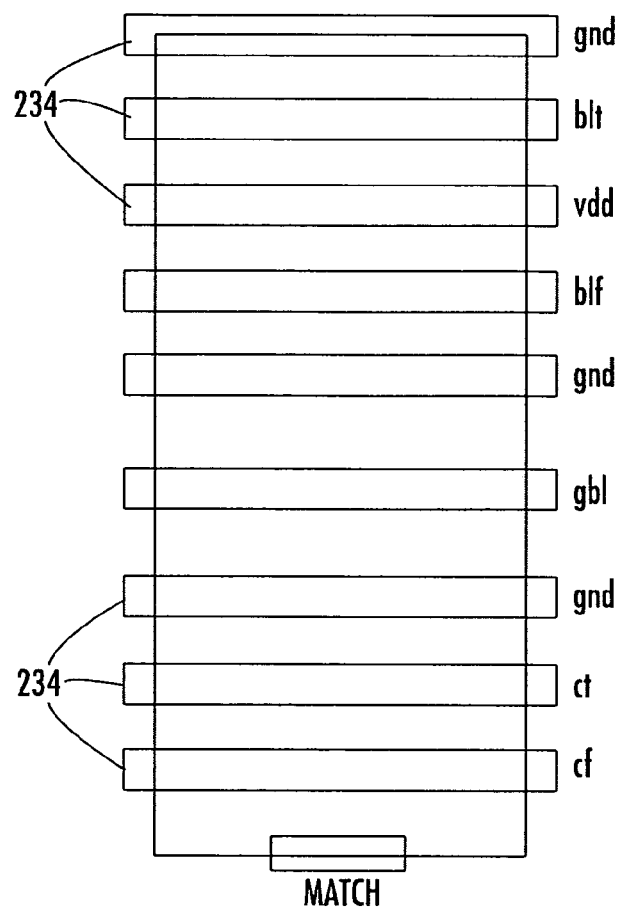
FIG. 21 is a graphic showing a third metal layout for various signal lines of the present invention.

FIG. 20 shows a second via layer 232 that connects up to another metal layer 234 shown in FIG. 21, which shows the different circuit lines taken serially from the top ground line (gnd), bitline true line (blt), high voltage or Vdd line (Vdd), bitline false line (blf), ground line (gnd), a global line (gbl), another ground line (gnd), a compare true line (ct), and compare false line (cf). The far right shows a matched line terminal that allows the interconnection. This can be a landing pad for a next level of metal that is not shown.

Figure 22:
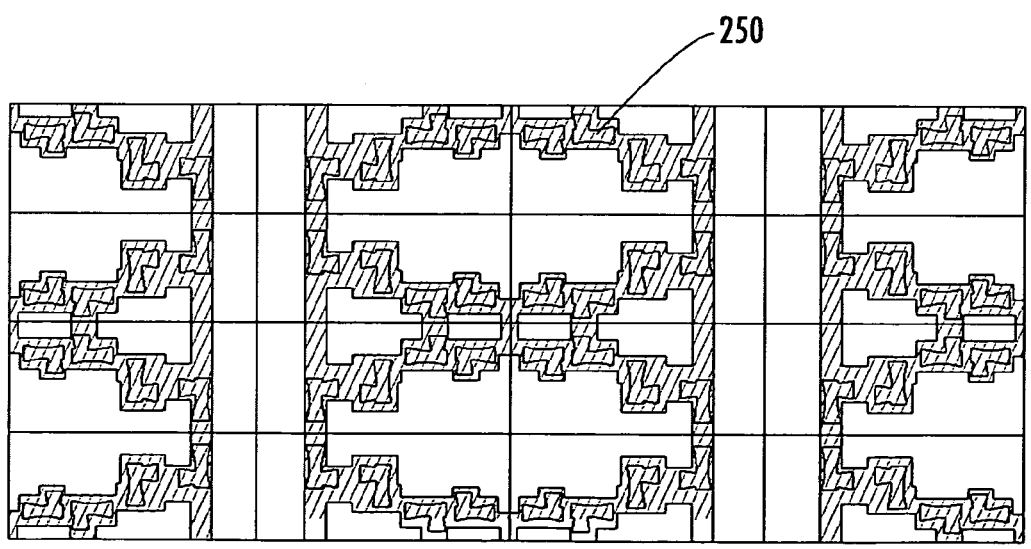
FIG. 22 is a graphic showing the layout of a 4×4 cell array with different quadrants.

FIG. 22 shows a capacitor level 250 for a 4×4 cell array with single cells placed together and showing different quadrants that reflect geometric configurations and two axis folded over each other with a stepped configuration.

It is evident that the present claimed invention provides an improvement over the CAM circuit shown in FIGS. 1–3 and described in the incorporated by reference '184 patent and provides added memory cell stability using the added capacitors between the common nodes and the memory cells and a common terminal as a VPL or plate voltage terminal for the capacitors.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A content addressable memory (CAM) circuit comprising:
a plurality of memory cells each having an internal node corresponding to one of a mask-true or data-true node and an internal node corresponding to one of a mask-false or data-false node;
a common terminal for the memory cells and operative as a capacitor plate layer common to said memory cells;
a compare circuit operative with the memory cells; and
a capacitor added between the internal nodes of each memory cell corresponding to the mask-true or data-true node and the mask-false or data-false node and the common terminal for memory cell stability.

2. A content addressable memory (CAM) circuit according to claim 1, wherein said memory cell comprise a Static Random Access Memory (SPAN) circuit.

3. A content addressable memory (CAM) circuit according to claim 1, and further comprising two series-connected capacitors added between the internal nodes of each memory cell and divided between the common terminal.

4. A content addressable memory (CAM) circuit according to claim 3, and further comprising a semiconductor layer common to the capacitors.

5. A content addressable memory (CAM) circuit according to claim 1, wherein said compare circuit comprises two active regions and a plurality of transistors formed over the two active regions.

6. A content addressable memory (CAM) circuit comprising:
first and second memory cells each having an internal node corresponding to one of a mask-true or data-true node and an internal node corresponding to one of a mask-false or data-false node;
a compare circuit operative with the first and second memory cells;
a common terminal for first and second memory cells and operative as a capacitor plate layer common to first and second memory cells; and
a capacitor added between the internal nodes of the memory cells corresponding to the mask-true or data-true node and the mask-false or data-false node and common terminal for memory cell stability.

7. A content addressable memory (CAM) circuit according to claim 6, wherein said first and second memory cells each comprises Static Random Access Memory (SRAM) circuits.

8. A content addressable memory (CAM) circuit according to claim 6, and further comprising two series-connected capacitors added between the internal nodes of each of the memory cells and divided between the common terminal.

9. A content addressable memory (CAM) circuit according to claim 8, and further comprising a semiconductor layer common to the capacitors and common terminal for first and second memory cells.

10. A content addressable memory (CAM) circuit according to claim 6, wherein said first memory cell is operative for storing a data value and the second memory cell is operative for storing an enable value for enabling the compare circuit.

11. A content addressable memory (CAM) circuit according to claim 6, wherein said compare circuit comprises two active regions and a plurality of transistors formed over the two active regions.

12. A content addressable memory (CAM) circuit according to claim 6, and further comprising a polysilicon region forming a local interconnect between the compare circuit and first memory cell.

13. A content addressable memory (CAM) circuit according to claim 6, and further comprising a polysilicon and conductive region forming a local interconnect between the compare circuit and the second memory cell.

14. A content addressable memory (CAM) circuit according to claim 6, wherein said common terminal for first and second memory cells has a voltage potential of about one-half the voltage potential for the memory cells.

15. A content addressable memory (CAM) circuit in a semiconductor substrate comprising:
first and second memory cells each having an internal node corresponding to one of a mask-true or data-true node and an internal node corresponding to one of a mask-false or data-false node;
a compare circuit operative with the first and second memory cells;
a common terminal for first and second memory cells and operative as a capacitor plate layer common to said memory cells;
a capacitor added between the internal nodes of the memory cells corresponding to the mask-true or data-true node and the mask-false or data-false node and common terminal for memory cell stability; and a metallization layer forming word lines and another metallization layer forming bitline and compare lines.

16. A content addressable memory (CAM) circuit according to claim 15, and further comprising ground lines formed within the metallization layer having the bitline and compare lines.

17. A content addressable memory (CAM) circuit according to claim 15, wherein said bitline lines comprise bitline true and bitline false lines.

18. A content addressable memory (CAM) circuit according to claim 15, wherein said compare lines comprise compare true and compare false lines.

19. A content addressable memory (CAM) circuit according to claim 15, wherein said first and second memory cells each comprises Static Random Access Memory (SRAM) circuits.

20. A content addressable memory (CAM) circuit according to claim 15, and further comprising two series-connected capacitors added between the internal nodes of each memory cell and divided between the common terminal.

21. A content addressable memory (CAM) circuit according to claim 20, and further comprising a semiconductor layer common to the capacitors and common terminal for first and second memory cells.

22. A content addressable memory (CAM) circuit according to claim 15, wherein said first memory cell is operative for storing a data value and the second memory cell is operative for storing an enable value for enabling the compare circuit.

23. A content addressable memory (CAM) circuit according to claim 15, wherein said compare circuit comprises two active regions and a plurality of transistors formed over the two active regions.

24. A content addressable memory (CAM) circuit according to claim 15, and further comprising a polysilicon region forming a local interconnect between the compare circuit and first memory cell.

25. A content addressable memory (CAM) circuit according to claim 15, and further comprising a polysilicon and conductive region forming a local interconnect between the compare circuit and the second memory cell.

26. A content addressable memory (CAM) circuit according to claim 15, wherein said common terminal for first and second memory cells has a voltage potential of about one-half the voltage potential for the memory cells.

* * * * *

UNITED STATES PATENT AND TRADEMARK OFFICE
CERTIFICATE OF CORRECTION

PATENT NO. : 7,233,512 B2 Page 1 of 1
APPLICATION NO. : 11/048224
DATED : June 19, 2007
INVENTOR(S) : Mark Lysinger, Francois Jacquet and Phillippe Roche It is certified that error appears in the above-identified patent and that said Letters Patent is hereby corrected as shown below:

Column 9, Line 63    Delete: "(SPAN)"
                     Insert: --(SRAM)--

Signed and Sealed this

Eighteenth Day of November, 2008

JON W. DUDAS
*Director of the United States Patent and Trademark Office*